US009827799B2

(12) United States Patent
Ko et al.

(10) Patent No.: US 9,827,799 B2
(45) Date of Patent: Nov. 28, 2017

(54) TRANSFER PRINTING SUBSTRATE

(71) Applicant: GWANGJU INSTITUTE OF SCIENCE AND TECHNOLOGY, Gwangju (KR)

(72) Inventors: Heung Cho Ko, Gwangju (KR); Su Ok Yun, Suwon-si (KR); Jeong Pil Park, Seoul (KR); Suk Ho Kim, Gumi-si (KR); Young Kyu Hwang, Gwangju (KR); Yujun Hyun, Gwangju (KR); Hun Soo Jang, Gwangju (KR); Yun Kyung Jeong, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 214 days.

(21) Appl. No.: 14/144,236

(22) Filed: Dec. 30, 2013

(65) Prior Publication Data
US 2014/0345794 A1    Nov. 27, 2014

(30) Foreign Application Priority Data

May 21, 2013  (KR) ........................ 10-2013-0057147

(51) Int. Cl.
*B41F 16/00*  (2006.01)
*B41M 5/025*  (2006.01)
(Continued)

(52) U.S. Cl.
CPC ........... *B41M 5/025* (2013.01); *H01L 51/003* (2013.01); *H01L 51/0004* (2013.01);
(Continued)

(58) Field of Classification Search
CPC .................................................. B65H 37/007
(Continued)

(56) References Cited

U.S. PATENT DOCUMENTS

2003/0057423 A1*  3/2003  Shimoda ............ H01L 21/6835
                                                              257/80
2010/0289124 A1*  11/2010  Nuzzo ............... H01L 21/02628
                                                              257/618

FOREIGN PATENT DOCUMENTS

JP    2006168297 A  *  6/2006
JP    2012186315 A     9/2012
(Continued)

OTHER PUBLICATIONS

Japanese Office Action dated Jan. 6, 2015 in connection with the counterpart Japanese Patent Application No. 2013-268851.

*Primary Examiner* — Brent O'Hern
(74) *Attorney, Agent, or Firm* — Hauptman Ham, LLP

(57) ABSTRACT

Disclosed herein is a transfer printing technology. A transfer printing substrate includes a plurality of pillar structures and a sacrificial layer applied thereon. In situ alignment of a transfer layer is performed by the pillar structures and a structural confinement by a concave structure formed on a bottom surface of the transfer layer corresponding to the pillar structures, or a chemical bond of the pillar structure and the transfer layer. In the in situ alignment by the structural confinement, the remaining sacrificial layer after being removed may serve as an adhesive component. The transfer process is performed by a separation of the bond by the sacrificial layer, a cutting of the pillar structures in the chemic bonding state of the pillar structures and the transfer layer, or a separation of the bond between the pillar structures and the handling substrate.

13 Claims, 15 Drawing Sheets

(51) Int. Cl.
*H01L 51/00* (2006.01)
*H01L 51/56* (2006.01)
(52) U.S. Cl.
CPC ...... *H01L 51/56* (2013.01); *H01L 2924/0002* (2013.01); *Y10T 428/24174* (2015.01)
(58) Field of Classification Search
USPC ........................................................ 428/119
See application file for complete search history.

(56) References Cited

FOREIGN PATENT DOCUMENTS

JP          2013209697 A    *  10/2013
KR      1020060125620 A       12/2006

* cited by examiner

[FIG. 1]
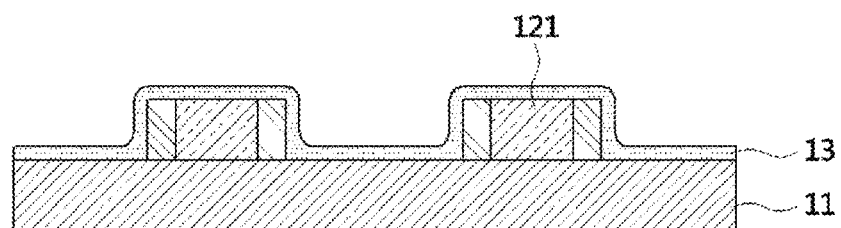
(a)
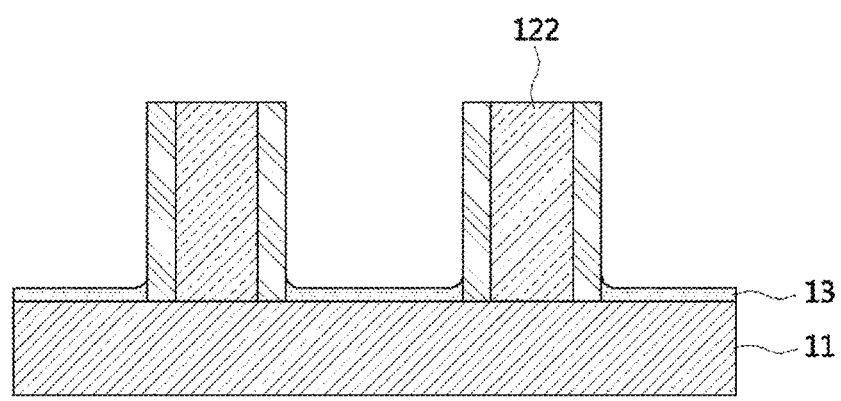
(b)

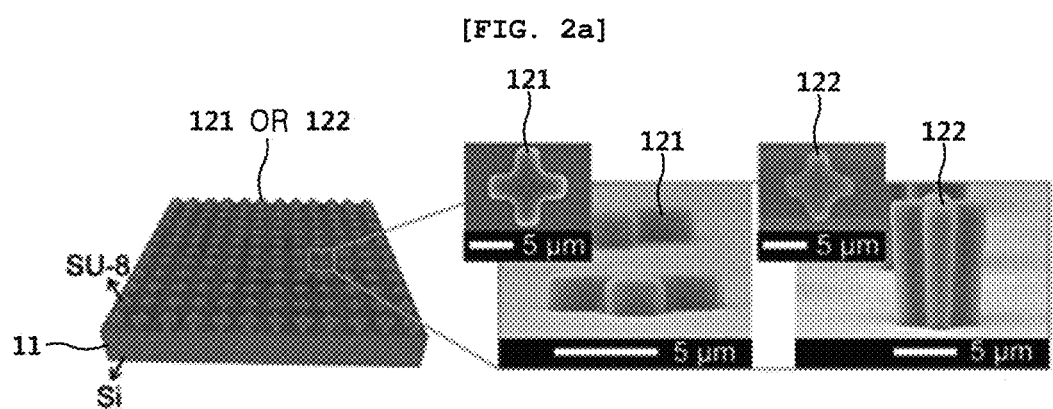
[FIG. 2a]

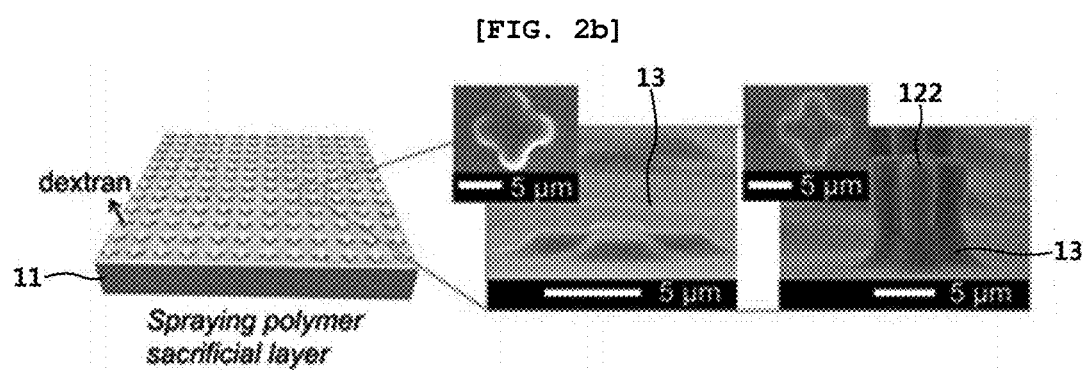
[FIG. 2b]

[FIG. 2c]
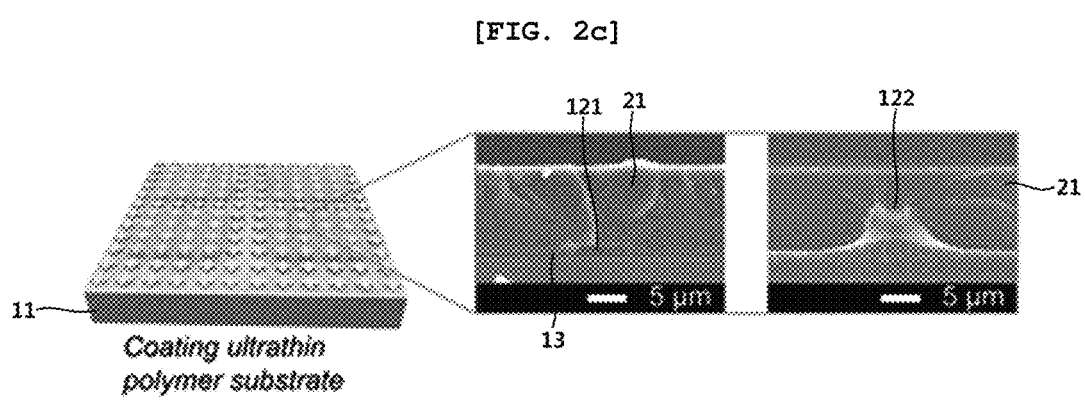

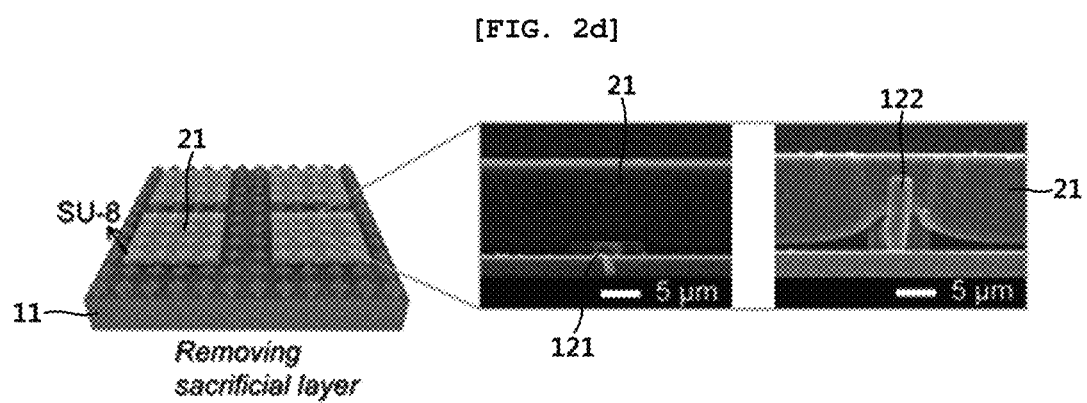
[FIG. 2d]

[FIG. 2e]
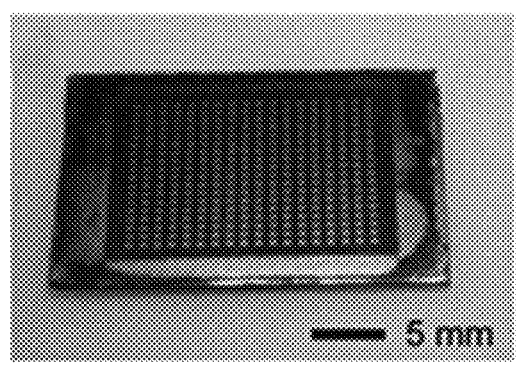

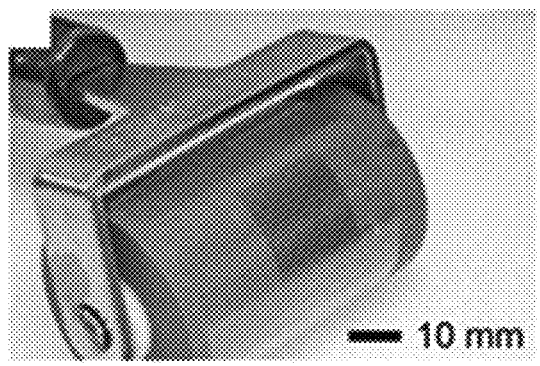
[FIG. 2f]

[FIG. 3]
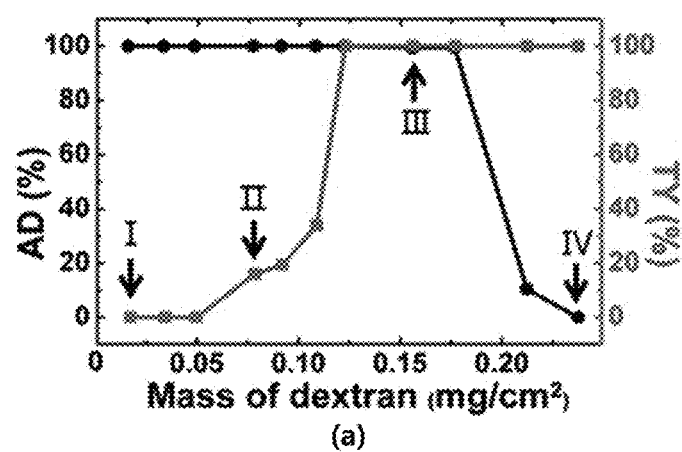
(a)
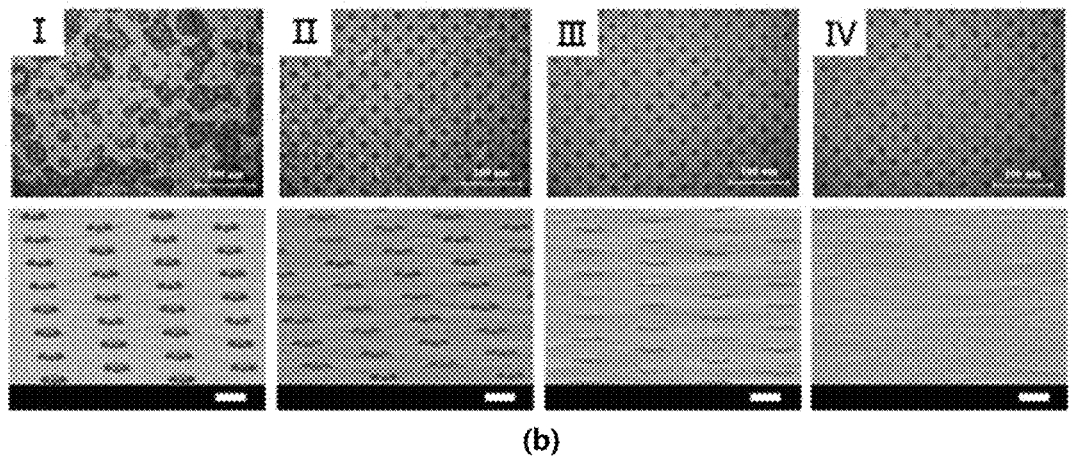
(b)

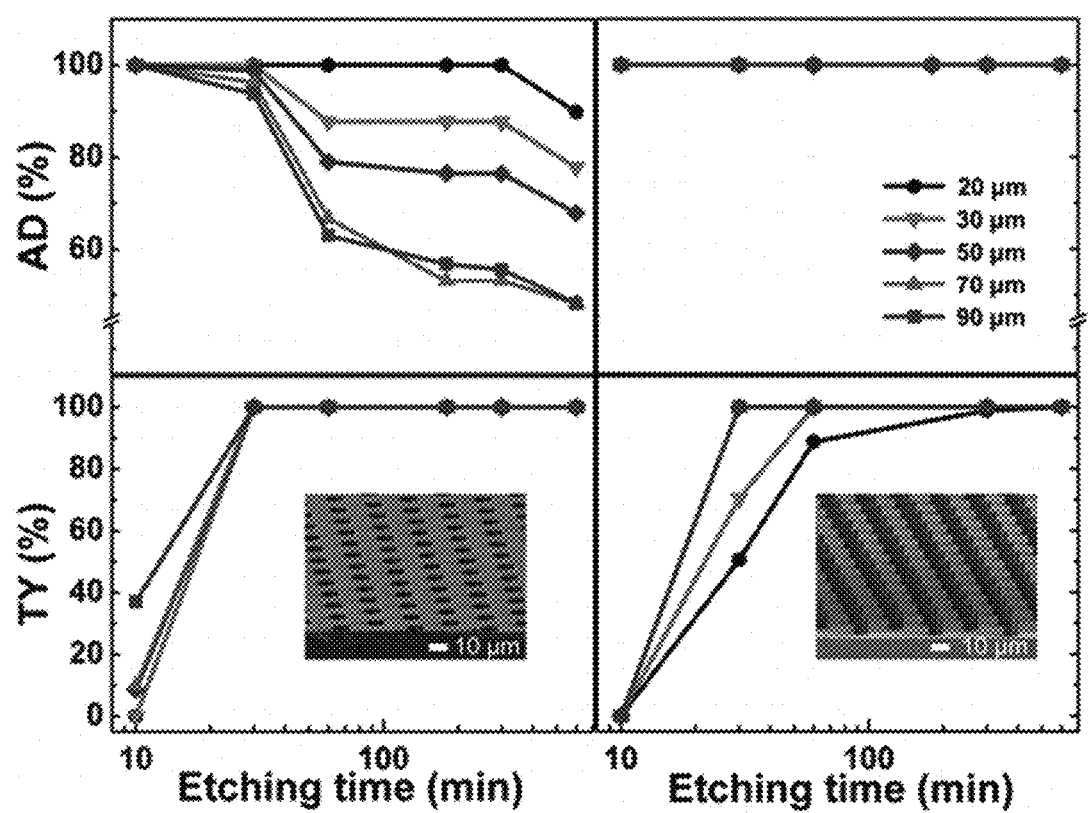
[FIG. 4]

[FIG. 5]
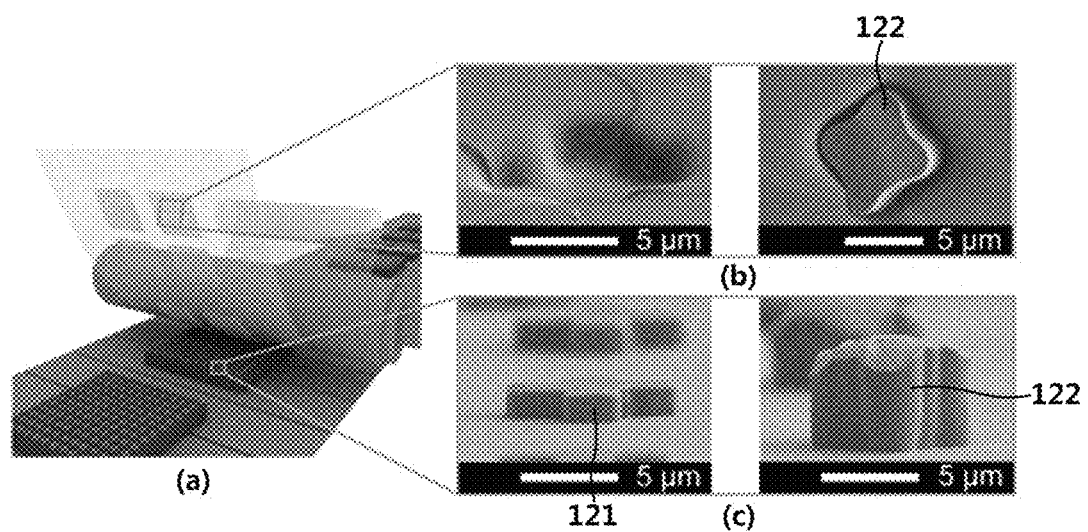

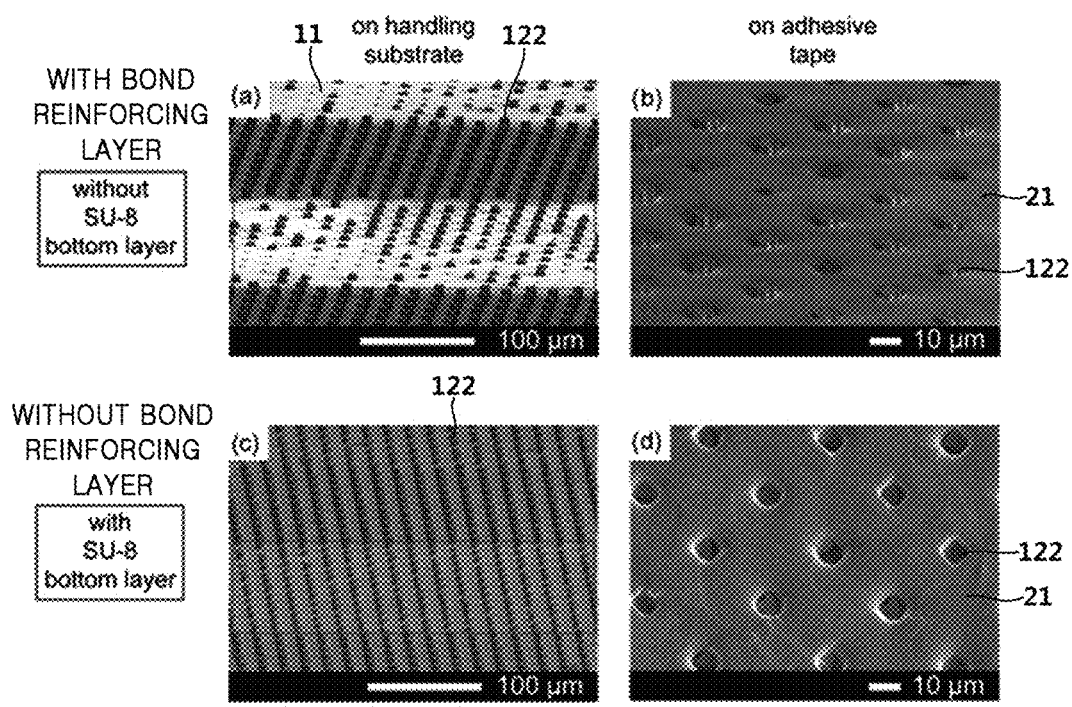
[FIG. 6]

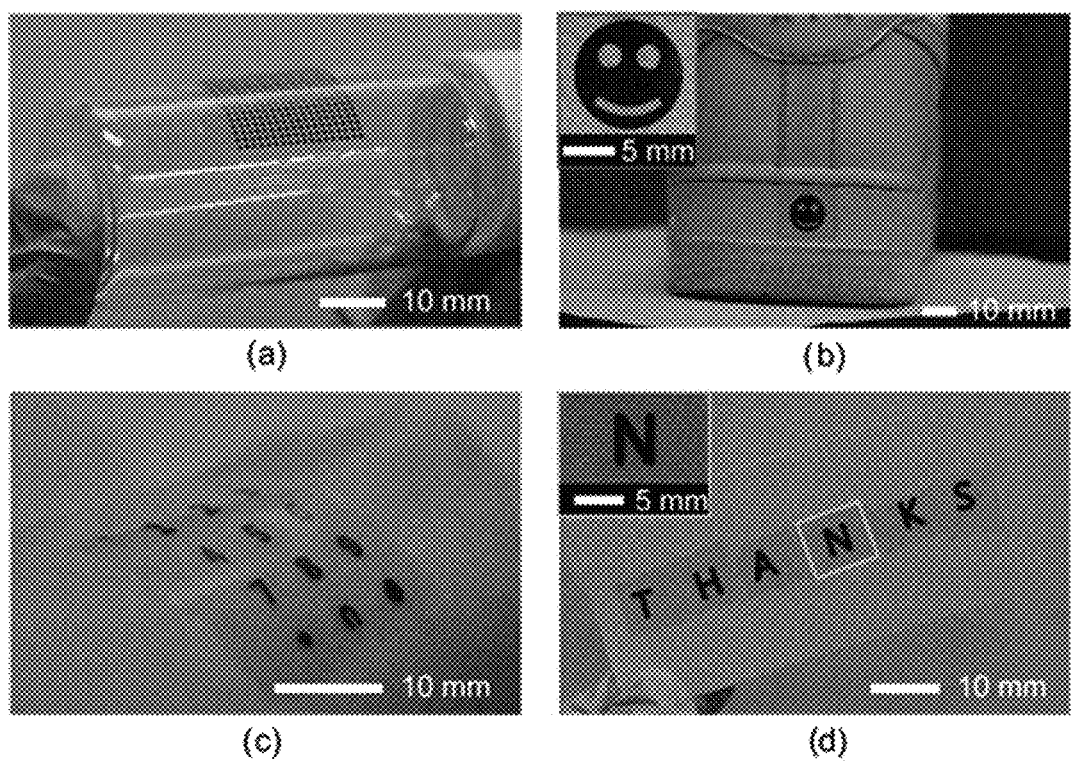

[FIG. 9]
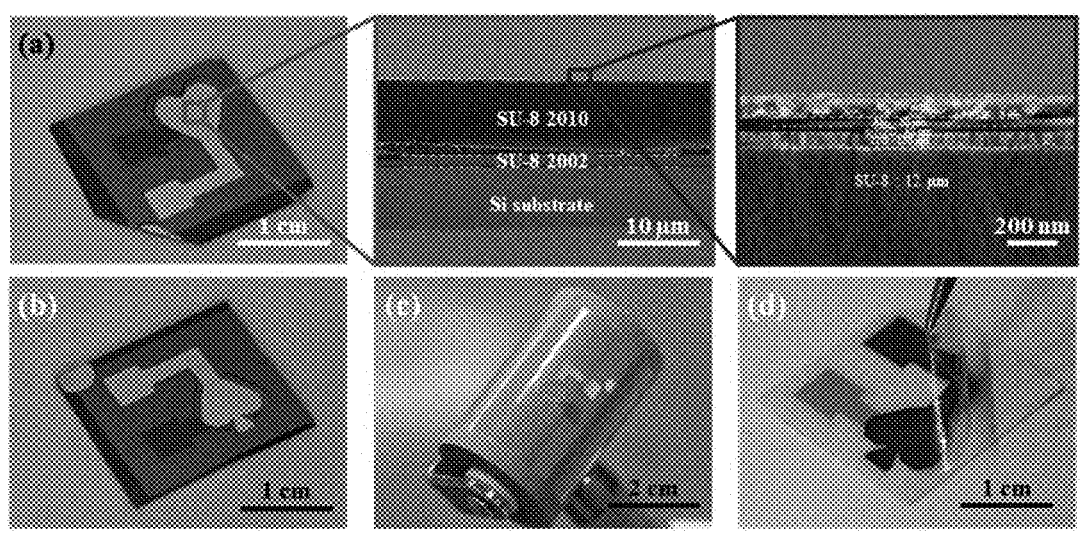

[FIG. 10]
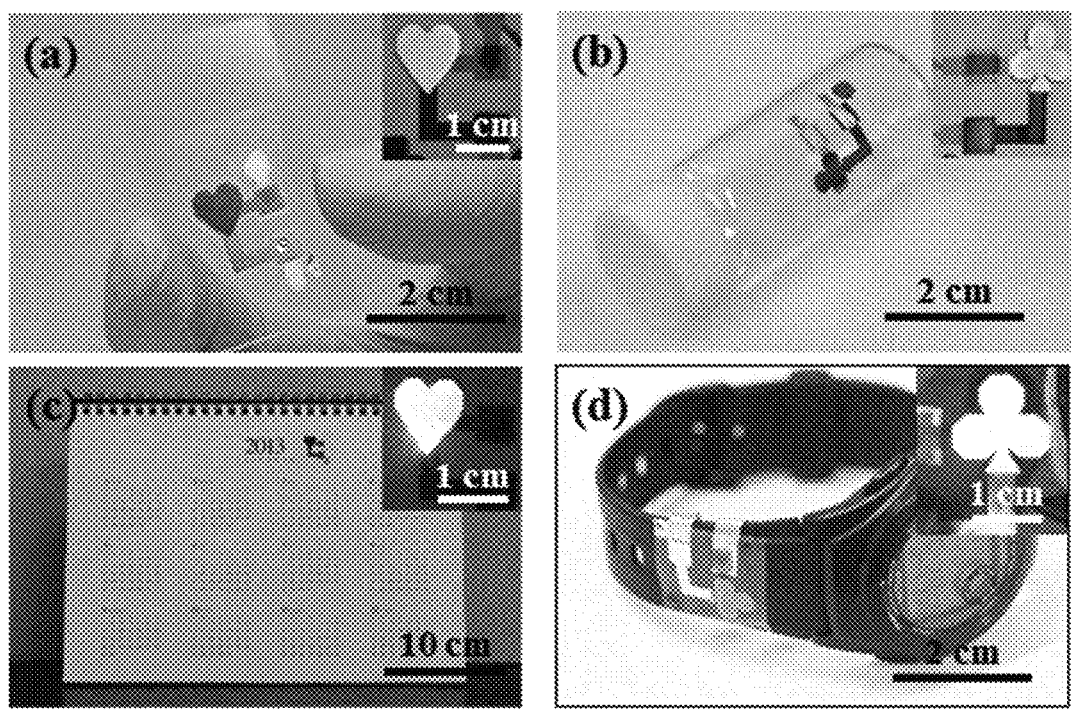

TRANSFER PRINTING SUBSTRATE

CROSS REFERENCE TO RELATED APPLICATION

This application claims the benefit of Korean Patent Application No. 10-2013-0057147, filed on May 21, 2013, which is hereby incorporated by reference in its entirety into this application.

BACKGROUND OF THE INVENTION

1. Technical Field

The present invention relates to a transfer printing field, and more particularly, to a transfer printing substrate capable of implementing high alignment and transfer rate even in a case of an ultra-thin film element by using a pillar structure, a manufacturing method thereof, and a method of transfer printing.

2. Description of the Related Art

Future electric and electronic elements need to have shape variability. For example, the reason is that the elements may be required to repeatedly deform shapes thereof such as clothes or human body organs, or may be attached to a building outer wall having various forms of surfaces in a deformed shape to thereby be maintained. Mechanical flexibility and elasticity enough to deform the form may be implemented by realizing an ultra-thinness of a structure of the element or reducing a thickness of a substrate itself. However, in the case in which the thickness of the substrate is reduced to several tens micrometers, the substrate is likely to be twisted or bent during a manufacturing process. Therefore, in order to secure stability required for an element process, a handling substrate supporting an ultra-thin film substrate has been used. In order to attach the ultra-thin film substrate supported by the handling substrate as described above to a desired surface, a transferring method having high alignment and transfer yield is required. For example, in order to adjust bonding force between the ultra-thin film substrate and the handling substrate, a scheme interposing a sacrificial layer between the substrates and removing the sacrificial layer after completing the process has been used. After the bonding force between the substrates becomes weaken by removing the sacrificial layer, the substrates are transferred onto the desired surface.

However, in the case in which the sacrificial layer is removed by an etching solution, the ultra-thin film substrate on the handling substrate floats and deviates from an original position, thereby decreasing alignment, or the ultra-thin film substrate immersed during an etching process is strongly bonded to the handling substrate, thereby decreasing the transfer yield.

As methods for solving the above-mentioned problems, a method of introducing a support maintaining a mechanical bond by forming a concave structure in the handling substrate or increasing alignment of the element by residue confined in a structural form during the etching process using a polymer sacrificial layer has been researched, and in addition to this, methods using a laser or using heat in order to decrease the bonding force between interfaces have been developed. There are problems in that the etching solution vulnerable to damage is used, a floating phenomenon of the pattern is caused due to a long etching time, it is costly, it is likely to be damaged by heat, and so forth.

Therefore, in manufacturing the ultra-thin film element having high flexibility and elasticity, a method capable of securing stability of a process and realizing high alignment and transfer yield is demanded.

RELATED ART DOCUMENT

Patent Document (Patent Document 1) Korean Patent Laid-Open Publication No. 10-2006-0125620

SUMMARY OF THE INVENTION

An object of the present invention is to provide a transfer printing substrate capable of implementing high transfer yield and alignment and maintaining stable bonding force between a handling substrate and an ultra-thin film substrate while minimizing damage to an element by using a pillar structure and a sacrificial layer.

Another object of the present invention is to provide a manufacturing method of the improved transfer printing substrate as described above.

Another object of the present invention is to provide a method of transfer printing using the improved transfer printing substrate and the manufacturing method thereof as described above.

According to an exemplary embodiment of the present invention, there is provided a transfer printing substrate supporting a transfer layer, the transfer printing substrate including: a handling substrate; and a plurality of pillar structures formed on the handling substrate.

The handling substrate may include a bond reinforcing layer for enforcing a bond between the handling substrate and the plurality of pillar structures.

The transfer printing substrate may further include a sacrificial layer applied onto the entire surface of the handling substrate including the plurality of pillar structures, wherein the sacrificial layer may be applied onto the plurality of pillar structures to expose upper portions of the plurality of pillar structures.

The sacrificial layer may be selectively removable for the transfer layer, the handling substrate, and the plurality of pillar structures.

The sacrificial layer may have adhesion with at least the pillar structures and the transfer layer.

The plurality of pillar structures may be formed of a material chemically bondable to the transfer layer.

According to another exemplary embodiment of the present invention, there is provided a manufacturing method of a transfer printing substrate supporting a transfer layer, the method including: forming a plurality of pillar structures on an upper surface of a handling substrate; and forming a sacrificial layer on the handling substrate, the sacrificial layer being formed so as to cover the entire surface including the plurality of pillar structures or expose upper portions of the plurality of pillar structures.

The forming of the plurality of pillar structures may include: applying a photosensitive polymer material on the handling substrate; and performing a photolithography process to form the plurality of pillar structures.

Before the applying of the photosensitive polymer material, a bond reinforcing layer increasing adhesion between the photosensitive polymer material and the handling substrate may be first formed on the handling substrate.

The sacrificial layer may have adhesion with at least the transfer layer and the plurality of pillar structures.

The sacrificial layer may be selectively removable for the handling substrate, the plurality of pillar structures, and the transfer layer.

The plurality of pillar structures may be formed of a polymer material chemically bondable to the transfer layer.

The sacrificial layer may be partially or entirely removed before the transfer layer is transferred on a transfer intermediate medium.

According to another exemplary embodiment of the present invention, there is provided a method of transfer printing, including: forming a plurality of pillar structures on an upper surface of a handling substrate; forming a sacrificial layer on the handling substrate, the sacrificial layer being formed so as to cover the entire surface including the plurality of pillar structures or expose upper portions of the plurality of pillar structures; manufacturing a portion or all of the transfer layer on an upper surface of the sacrificial layer or the entire surface including the sacrificial layer and upper surfaces of the plurality of pillar structures; selectively removing a portion or all of the sacrificial layer; and transferring the transfer layer on a transfer intermediate medium.

The method may further include, before the forming of the sacrificial layer, forming a bond reinforcing layer for enforcing a bond between the handling substrate and the plurality of pillar structures on an upper surface of the handling substrate.

The sacrificial layer may bond the transfer layer to the handling substrate and the plurality of pillar structures.

The plurality of pillar structures may be formed of a material chemically bondable to the transfer layer.

In the transferring of the transfer layer, the transferring of the transfer layer on the transfer intermediate medium may be performed by a separation of the bond between the transfer layer and the handling substrate or the plurality of pillar structures by the sacrificial layer, a cutting of the plurality of pillar structures, or a separation of the bond between the plurality of pillar structures and the handling substrate.

BRIEF DESCRIPTION OF THE DRAWINGS

FIG. 1 is a view schematically showing a transfer printing substrate according to an exemplary embodiment of the present invention;

FIGS. 2A to 2F are views for describing a manufacturing method of the transfer printing substrate and a method of transfer printing according to an exemplary embodiment of the present invention;

FIGS. 3A and 3B show alignment degree AD and transfer yield TY according to an applied amount of a sacrificial layer in the method of transfer printing according to the exemplary embodiment of the present invention;

FIG. 4 is a graph showing alignment degree and transfer yield according to an etching time for removing the sacrificial layer in the method of transfer printing according to the exemplary embodiment of the present invention;

FIGS. 5A to 5C are views showing processes which are transfer printed on a tape (transfer intermediate medium) using a roller in the method of transfer printing according to the exemplary embodiment of the present invention;

FIGS. 6A to 6D are views showing transfer processes of a case using a pillar structure formed to have a height of 10 μm in the method of transfer printing according to the exemplary embodiment of the present invention;

FIGS. 7A to 7D are views showing examples in which transfer layers having various shapes are transferred on various forms and kinds of surfaces using the method of transfer printing according to the exemplary embodiment of the present invention;

FIGS. 9A to 9D are views showing processes of transfer printing a semiconductor device according to the method of transfer printing according to the exemplary embodiment of the present invention; and FIGS. 10A to 10D are views showing examples of various transfer printings performed according to the method of transfer printing according to the exemplary embodiment of the present invention.

DESCRIPTION OF THE EXEMPLARY EMBODIMENTS

Figure 8:
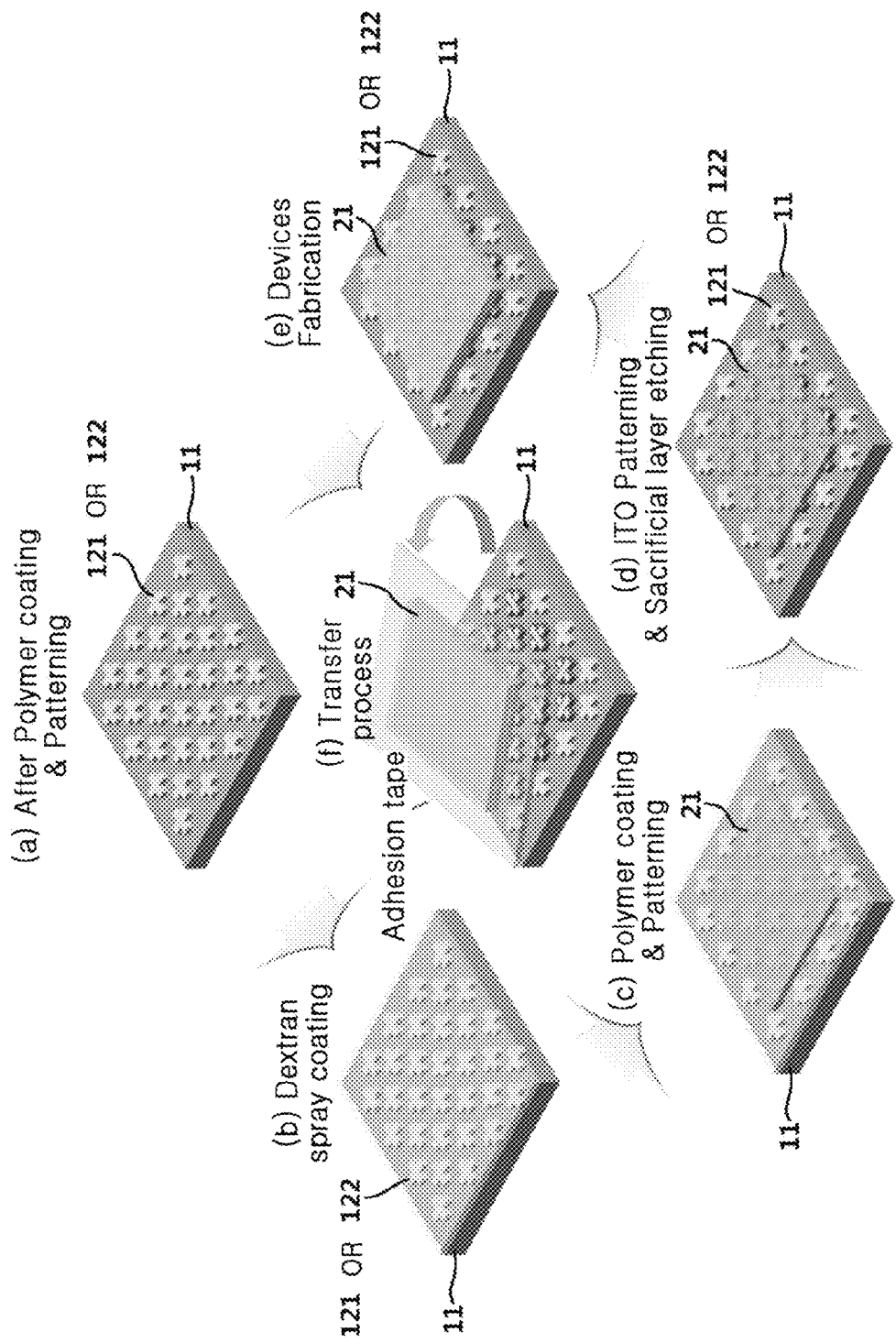
FIGS. 8A to 8F are views showing manufacturing processes using an OLED element as the transfer layer in the method of transfer printing according to the exemplary embodiment of the present invention.

Hereinafter, exemplary embodiments of the present invention will be described in detail with reference to the accompanying drawings. When it is determined that the detailed description of the known art related to the present invention may obscure the gist of the present invention, the detailed description thereof will be omitted.

First, briefly describing, according to the present invention, the polymer is coated on a handling substrate, for example, a silicon wafer using a spin coating and a plurality of pillar structures are then formed by a photolithography process. In this case, in order to increase bonding force between the handling substrate and the polymer pillar structure, after the polymer is coated in a film form, the pillar structure may be formed thereon. A sacrificial layer is applied on an upper layer of the handling substrate having the plurality of pillar structures formed thereon, using various methods such as a spray coating method, a spin coating method, and the like, for example. In the case in which the pillar structure has a low height, the above-mentioned sacrificial layer is applied so as to cover the entire surface of the handling substrate including the pillar structure. In the case in which the pillar structure has a high height, the sacrificial layer is applied onto the handling substrate so that an upper portion of the pillar structure is exposed. In this case, the sacrificial layer is applied onto only the upper surface of the handling substrate and a lower layer portion of the pillar structure, such that the upper portion of the pillar structure remains as a portion without the sacrificial layer. Due to this difference, different schemes are used in bonding with a transfer layer formed on the pillar structure and separating the transfer layer for transferring, and alignment degree and transfer yield may be adjusted by different principles for each scheme. For example, in a case of the pillar structure having the low height, a residue sacrificial layer is present on the upper surfaces of the pillar structures or thereabout by a structural confinement, which serves as an adhesive. On the contrary, in a case of the pillar structure having the high height, the exposed portion on the pillar structure is chemically bonded to the transfer layer. From both cases, alignment degree and transfer yield of nearly 100% may be obtained. In the case of the pillar structure having the low height, the transfer is performed by a separation of the bond between the transfer layer and the handling substrate or the plurality of pillar structures by the sacrificial layer upon the transferring, and in the case of the pillar structure having the high height, the transfer is performed by disconnection (break) of the pillar structures which are chemically bonded to the transfer layer. A manufacturing process is performed in a state in which the transfer layer is supported by the handling substrate having the pillar structure formed thereon. For example, a manufacturing process of a semiconductor device such as a laminate, a photolithography, an etching, or the like is performed. In addition, in some cases, when the transfer layer is the elements such as organic and inorganic display element, a solar cell, and the like, in order to prevent components of the element from being damaged upon the removal of the sacrificial layer, a process forming the components of the element in a state in which a substrate of the transfer layer is formed and the sacrificial layer is then removed may be performed.

FIGS. 1A and 1B are views schematically showing a transfer printing substrate according to an exemplary embodiment of the present invention.

Referring to FIGS. 1A and 1B, a transfer printing substrate 1 according to the exemplary embodiment of the present invention may include a handling substrate 11 and a plurality of pillar structures 121 and 122. In addition, the transfer printing substrate 1 according to the exemplary embodiment of the present invention may include a sacrificial layer 13.

The handling substrate 11, which includes a silicon wafer, may be any substrate made of a material which is bonded to the pillar structures 121 and 122 formed thereon. The handling substrate 11 may include a bond reinforcing layer (not shown) for reinforcing the bond between the handling substrate 11 and the pillar structures 121 and 122 on an upper layer thereof. The above-mentioned bond reinforcing layer, which is for example, a polymer material, may be applied onto the handling substrate 11.

The plurality of pillar structures 121 and 122 formed on the upper surface of the handling substrate 11 may be, for example, a photosensitive polymer material such as SU-8. The above-mentioned material may form the pillar structures 121 and 122 by a relatively simple process such as a photolithography process. Shapes of the plurality of pillar structures 121 and 122 may relatively increase an area contacting a transfer layer 21 formed later when a plane cross-section shape has a shape such as a cross shape, or the like as shown, but are not particularly limited.

The plurality of pillar structures 121 and 122 used in the present invention may have two examples according to the height of the pillar structure and a scheme bonding the plurality of pillar structures 121 and 122 and the transfer layer 21 formed thereon. For example, one example is that the plurality of pillar structures 121 and 122 have a low height, such that the sacrificial layer 13 is formed so as to cover both the handling substrate 11 and the plurality of pillar structures 121 and 122. In addition, the other example is that the plurality of pillar structures 121 and 122 have a relatively high height, such that the sacrificial layer 13 applied onto the handling substrate 11 is formed so as to expose upper portions of the plurality of pillar structures 121 and 122. Arrangement interval between the pillar structures 121 and 122 and the height (thickness) of the applied sacrificial layer 13 are adjusted according to the two cases of the present invention as described above, such that alignment degree and transfer yield at nearly 100% may be achieved.

Hereinafter, a manufacturing method of the transfer printing substrate and a method of transfer printing according to an exemplary embodiment of the present invention will be described in detail with reference to the accompanying drawings.

FIGS. 2A to 2F are views for describing a manufacturing method of the transfer printing substrate and a method of transfer printing according to an exemplary embodiment of the present invention. At the left in FIGS. 2A to 2F is a perspective view, and at the right is an electron microscopy photograph of a practically manufactured substrate. Particularly, the height of the plurality of pillar structures 121 and 122 is shown as two kinds in the electron microscopy photograph of the right, which represent two embodiments of the manufacturing method of the transfer printing substrate according to the present invention.

Referring to FIGS. 2A to 2F, the manufacturing method of the transfer printing substrate according to the exemplary embodiment of the present invention may include forming the plurality of pillar structures 121 and 122 on the upper surface of the handling substrate 11 as shown in FIG. 2A.

For example, after a photosensitive polymer material such as SU-8 is applied onto the handling substrate 11 such as a silicon wafer, the plurality of pillar structures 121 and 122 are formed by a photolithography process. As described above, the plurality of pillar structures 121 and 122 may have different heights according to the bond schemes in which they are bonded to the transfer layer 21 formed later. That is, in the case in which the plurality of pillar structures 121 and the transfer layer 21 are bonded to each other by the sacrificial layer 13, the pillar structures 121 have a relatively low height, and in the case in which the pillar structures 122 are chemically bonded to the transfer layer 21, the pillar structures 121 have a relatively high height. In the exemplary embodiments of the present invention, the plurality of pillar structures 121 and 122 are formed so as to have the heights of 2 µm and 10 µm, respectively.

Next, as shown in FIG. 2B, the sacrificial layer 13 is formed on the handling substrate 11. As a material for the sacrificial layer 13, for example, 2% dextran which is a polymer material is used. For example, the 2% dextran may be applied using a method such as a spray coating method or a spin coating method.

The sacrificial layer 13 may use an organic or inorganic material. For example, in a case of the organic material, dextran, polyacrylic acid (PAA), polymethyl methacrylate (PMMA), polystyrene, and the like may be used, which may be applied using the spin coating method and the spray coating method. In a case of the inorganic material, nickel, copper, chrome, aluminum, and the like may be used, which may be formed by electron beam deposition, sputtering deposition, thermal deposition, and the like.

In the case in which the plurality of pillar structures 121 have the low height such as 2 µm as in the left of the electron microscopy photograph of FIG. 2B, the sacrificial layer 13 is formed so as to cover the entire surface including the handling substrate 11 and the plurality of pillar structures 121.

In the case in which the plurality of pillar structures 122 have the high height such as 10 µm as in the right of the electron microscopy photograph of FIG. 2B, the sacrificial layer 13 is applied onto the handling substrate 11 so as to partially expose upper portions of the plurality of pillar structures 122.

The material used as the above-mentioned sacrificial layer 13, which is the polymer material, is a material at least having adhesion with the transfer layer 21 formed later and the plurality of pillar structures 121 and 122. Of course, the sacrificial layer 13 may also have adhesion with the handling substrate 11. In addition, the material used as the sacrificial layer 13 is a material capable of being selectively removed for the handling substrate 11, the plurality of pillar structures 121 and 122, and the transfer layer 21.

Next, the transfer layer 21 is formed on the upper surface of the sacrificial layer 13 as shown in FIG. 2C. The transfer layer 21 may be a multi-layer such as a fine semiconductor device. In the present operation, all layers of the transfer layer 21 may be formed or a portion such as a substrate of the transfer layer may be formed.

It may be seen from the photograph of FIG. 2C, that an ultra-thin film substrate is laminated on the sacrificial layer 13 having a size 500 μm×500 μm. This may be formed by performing the photolithography process for SU-8 which is the photosensitive polymer material, for example. A photograph of a cutting surface obtained using an electron microscope shows that the respective plurality of pillar structures 121 and 122 are embedded inside an ultra-thin film substrate of the transfer layer 21. This prevents the ultra-thin film substrate, which is the transfer layer 21 from being floated on the handling substrate 11 after removing the sacrificial layer 13 or being deviated from an original position in a next operation.

As shown in FIG. 2D, a portion or all of the sacrificial layer 13 is selectively removed. For example, the sacrificial layer 13 was removed using a third distilled water, which is dextran etchant, at a temperature of 50° C., and it may be confirmed from the photograph that the transfer layer 21 is fixed even after the sacrificial layer 13 is removed.

This is the reason that the portion of the sacrificial layer 13 remains to thereby bond the transfer layer 21 in the case of the pillar structure 121 having the low height such as 2 μm. This is a structural confinement and since a concave portion is mainly formed on a bottom surface of the transfer layer 21 by the plurality of pillar structures 121, the sacrificial layer is not completely removed around the concave portion and the portion thereof remains to thereby serve as an adhesive component.

In addition, in the case of the pillar structure 122 having the high height such as 10 μm, the upper portion of the pillar structure 122 exposed to the outside the sacrificial layer 13 is chemically bonded to the ultra-thin film substrate of the transfer layer 21. For example, the SU-8 used as the plurality of pillar structures 121 and 122 and the SU-8 used as the ultra-thin film substrate of the transfer layer 21 are chemically bonded to each other. In a case of the chemical bond, constant bonding force is produced regardless of an etching time for removing the sacrificial layer 13.

A timing of removing the sacrificial layer 13 may be selected according to components of constituents of the transfer layer 21. For example, the timing of removing the sacrificial layer 13 may be a timing capable of selectively removing the sacrificial layer 13 for the transfer layer 21, the plurality of pillar structures 121 and 122, and the handling substrate 11.

Next, as in the photographs shown in FIGS. 2E and 2F, the transfer layer may be transferred on a tape (transfer intermediate medium) by a rolling method in as state in which the alignment degree and the transfer yield of 100% are maintained.

In a case in which the plurality of pillar structures 121 have the height of 2 μm, the transfer is performed while the bond of the remaining sacrificial layer portions is separated, and in a case in which the plurality of pillar structures have the height of 10 μm, the transfer is performed while the plurality of pillar structures 122 are cut.

FIGS. 3A and 3B show alignment degree AD and transfer yield TY according to an amount of a sacrificial layer 13 applied onto the pillar structure having the height of 2 μm. As the sacrificial layer 13, 2% dextran was applied onto the pillar structures having the cross shape in various thicknesses using the spray coating method. In the case in which an amount of dextran of 0.09 mg/cm² or less (I, II) was applied onto the handling substrate 11, since the pillar structures and portions in which the dextran is not applied onto the surface of the handling substrate directly contact the ultra-thin film substrate to thereby produce strong bonding force, the alignment degree is high, but the transfer yield is decreased. On the contrary, in the case in which an amount of dextran of 0.2 mg/cm² (IV) was applied onto the handling substrate, since it too thickly covers the handling substrate 11 and the plurality of pillar structures 121 to thereby limit the role of the plurality of pillar structures 121, the transfer yield is high, but the alignment degree is decreased. In the exemplary embodiments, the alignment degree and the transfer yield of 100% were obtained in the case in which an amount of dextran of 0.122 to 0.177 mg/cm² (III) was applied onto the handling substrate. In this case, this is the reason that the remaining sacrificial layer remained in the pillar structures during the removal of the sacrificial layer 13 maintains the bonding force.

FIG. 4 is a graph showing alignment degree and transfer yield according to an etching time for removing the sacrificial layer 13 according to the exemplary embodiment of the present invention. The heights of the pillar structures were formed so as to have 2 μm and 10 μm, respectively, and intervals were variously formed at 20 to 90 μm. The dextran, which is the sacrificial layer, was applied at the amount of 0.122 to 0.177 mg/cm² which is confirmed by the above experiment. In the case of the pillar structures having the low height, the alignment degree is gradually decreased according to the etching time and a change degree is increased as the interval broadens. On the contrary, the transfer yield is increased. The alignment degree and the transfer yield of 100% may be obtained from the pillar structures having the interval of 20 μm. In the case of the pillar structures having the high height, the alignment degree is uniformly maintained due to the chemical bond of the pillar structures to thereby be maintained at 100% according to the etching time regardless of the interval, but the transfer yield is decreased as the etching time is short and has a larger change rate as the interval of the pillar structures is narrow. The alignment degree and the transfer yield of 100% were produced at various etching times at each interval.

FIGS. 5A to 5C are views showing processes which are transfer printed on a tape (transfer intermediate medium) using a roller. In the case of using the pillar structures formed to have the heights of 2 μm and 10 μm, respectively, as described above, the transfer layer is transferred using different principles using the adhesion by the remaining sacrificial layer and the chemical bonding force between the plurality of pillar structures 122 and the ultra-thin film substrate of the transfer layer 21. It may be confirmed that the pillar structure 121 having the height of 2 μm maintain an original structure on the handling substrate even after being transferred, and the transfer layer 21 transferred on the tape has a depression form of the pillar structure 121 and the inner remaining sacrificial layer (see a left of FIGS. 5B and 5C). It may be seen that in the case of the pillar structure having the height of 10 μm, the broken pillar structure 122 may be seen on the handling substrate 11 and the broken pillar structure 122 is embedded into the surface of the ultra-thin film substrate of the transfer layer 21 transferred on the tape (see a right of FIGS. 5B and 5C).

FIGS. 6A to 6D show that the transfer process is performed by the break or disconnection of the pillar structure 122 in the case of using the pillar structure 122 formed to have the height of 10 μm. In the case in which the handling substrate 11 and the plurality of pillar structures 121 and 122 are directly bonded to each other, the transfer process may be performed by the cutting of the pillar structure 122 or the separation of the pillar structure 122 from the handling substrate 11 (see FIGS. 6A and 6B). Alternatively, when the polymer material as a bond reinforcing layer is applied onto the handling substrate 11 before forming the pillar structure 122 on the handling substrate 11 and the plurality of pillar structures 121 and 122 are then formed, the bonding force between the handling substrate 11 and the pillar structure 122 is enforced, such that the transfer process may be performed by only the disconnection phenomenon of the pillar structure 122 (see FIGS. 6C and 6D).

FIGS. 7A to 7D show that the transfer layer 21 having various shapes (a quadrangle of 500 μm×500 μm, numerals, letters, and so forth) may be transferred on various forms and kinds of surfaces such as a surface of a glass bottle having a non-planar form, shoes, body skin, and paper using the method of transfer printing according to the exemplary embodiment of the present invention. This shows that in the case in which various elements such as the organic and inorganic displays and the solar cell are manufactured on the ultra-thin film substrate, an ultra-thin film flexible element of a sticker having various functions may be manufactured.

FIGS. 8A to 8F are views showing processes of manufacturing an OLED element as the transfer layer 21 in the method of transfer printing according to the exemplary embodiment of the present invention.

As shown in FIG. 8A, first, the SU-8, which is the polymer material as the bond reinforcing layer is applied onto the handling substrate 11 and the plurality of pillar structures 121 and 122 are formed thereon using the same SU-8. As shown in FIG. 8B, the dextran is applied onto the upper surface of the handling substrate 11 having the plurality of pillar structures 121 and 122 formed thereon using the spray coating method to thereby form the sacrificial layer 13. The heights of the plurality of pillar structures 121 and 122 and the applied amount of the sacrificial layer may be adjusted so as to match a desired condition as described above. Next, as shown in FIG. 8C, the ultra-thin film substrate, which is a portion of the transfer layer 21 was formed on the upper surface of the handling substrate 11 having the plurality of pillar structures 121 and 122 and the sacrificial layer 13. For example, as the ultra-thin film substrate, the SU-8 was applied by the spin coating method and was formed in a desired shape by the photolithography process. As shown in FIG. 8D, by depositing ITO (150 nm), which is an electrode material, by a sputtering apparatus and removing the sacrificial layer 13 using the third distilled water having the temperature of 50° C., which is the etchant suitable for the sacrificial layer 13, a wet etching process, which is likely to damage the element, was first performed. Next, as shown in FIG. 8E, processes of other elements were performed. For example, a hole transport layer, an active layer, and an electron transport layer (NPD: 40 nm, Alq3: 50 nm, LiF: 2 nm) of the OLED and an aluminum electrode (100 nm) were deposited. When the manufacturing of the transfer layer 21 is completed as described above, the transfer layer 21 has been transfer printed on various surfaces as shown in FIG. 8F.

FIGS. 9A to 9D show photographs of the completed process of the element, which is the transfer layer after the plurality of pillar structures 121 and 122 having the height of 2 μm are formed on the silicon handling substrate 11 at the interval of 20 μm. A cut surface photograph using the electron microscope of FIG. 9A shows an element manufactured by depositing the respective structures and materials, wherein the element has an ultra-thin film form having the total thickness of 13 μm. This is an example of a roll-to-roll process, wherein the transfer is possible by fixing the tape on the roller and then directly rolling it on a sample, and the manufactured element has high flexibility (see FIGS. 9B to 9D).

FIGS. 10A to 10D are examples forming the plurality of pillar structures 121 and 122 having the height of 10 μm at the interval of 100 μm and obtained by displaying, wherein after the OLED is formed, it is transferred on the substrates having various kinds of surfaces and materials, and the non-planar structures such as a flat glass substrate, a glass bottle having a curved surface, a calendar, and a watch strap, a driving thereof was confirmed. It was confirmed that the elements manufactured on the transferable ultra-thin film substrate may be operated by transferring on a thin tape or a double tape to thereby directly attach to various surfaces.

According to the exemplary embodiment of the present invention, since the transfer layer and the handling substrate are bonded and separated to and from each other by forming the pillar structures on the handling substrate, high alignment and transfer yield may be implemented. The above mentioned pillar structures form the concave structures on the lower surface of the transfer layer, thereby structurally confine the transfer layer. Although the process for removing the sacrificial layer is performed, the portion of the pillar structures structurally remains to thereby serve as the adhesive, or the pillar structures and the transfer layer are chemically bonded to thereby confine the transfer layer in situ. In addition, although the sacrificial layer is removed, the handling substrate and the polymer substrate are not completely bonded, such that the bonding force becomes weaken, thereby making it possible to easily perform the transfer. The sacrificial layer using the water soluble polymer may perform the element process under the relaxed condition as compared to other etchants such as water, and several other sacrificial layer materials are removed before the element process, thereby making it possible to remove possibility of damage for the element. The pillar structure may be manufactured by various materials and may adjust the bonding force by adjusting various factors such as the height, the shape, the thickness, and the like. In addition, since the pillar structure may be easily formed on various kinds of handling substrates, it is not limited to the kind of handling substrates. Since the pillar structure is formed on the handling substrate unlike the scheme etching the handling substrate itself to manufacture the support, it may be inexpensive and may be formed in the simple process in terms of the method aspect. In addition to this, the factors capable of causing damage for the element such as the etchant and heat may be removed in advance unlike the existing method, and the constant bonding force between the ultra-thin film substrate and the handling substrate is maintained by the pillar structure despite of the long etching time, thereby having high transfer yield and alignment.

While the present invention has been described in connection with the exemplary embodiments thereof, it is obvious to those skilled in the art that various modifications and variations can be made without departing from the scope of the present invention.

What is claimed is:
1. A transfer printing substrate comprising:
    a transfer layer;
    a handling substrate; and
    a plurality of pillar structures formed on the handling substrate, and bonded to the transfer layer, wherein the plurality of pillar structures are bonded to the handling substrate, the plurality of pillar structures comprises a photosensitive polymer material, and the transfer printing substrate is configured to transfer the transfer layer by a separation between the transfer layer and the plurality of pillar structures.

2. The transfer printing substrate of claim 1, wherein the handling substrate includes a bond reinforcing layer for enforcing a bond between the handling substrate and the plurality of pillar structures.

3. A transfer printing substrate comprising:
a transfer layer;
a handling substrate;
a plurality of pillar structures formed on the handling substrate, and bonded to the transfer layer; and
a sacrificial layer applied onto at least a part of a surface of the handling substrate including the plurality of pillar structures, wherein
the transfer printing substrate is configured to transfer the transfer layer by a separation between the transfer layer and the plurality of pillar structures,
the sacrificial layer covers the plurality of pillar structures or exposes upper portions of the plurality of pillar structures, and
the sacrificial layer is selectively removable for the transfer layer, the handling substrate, and the plurality of pillar structures.

4. The transfer printing substrate of claim 3, wherein the sacrificial layer has adhesion with the plurality of pillar structures and the transfer layer.

5. The transfer printing substrate of claim 3, wherein the plurality of pillar structures is formed of a material chemically bondable to the transfer layer.

6. The transfer printing substrate of claim 3, wherein each pillar structure of the plurality of pillar structures is formed from a photosensitive polymer material.

7. The transfer printing substrate of claim 3, wherein each of the plurality of the pillar structures has a height range from 2 micrometers ($\mu$m) to 10 $\mu$m.

8. The transfer printing substrate of claim 3, wherein the sacrificial layer comprises at least one organic material selected from the group consisting of dextran, polyacrylic acid (PAA), polymethyl methacrylate (PMMA) and polystyrene, at least one inorganic material selected from the group consisting of nickel, copper, chrome and aluminum, or a combination of the at least one organic material and the at least one inorganic material.

9. The transfer printing substrate of claim 3, wherein the sacrificial layer comprises dextran, and wherein the dextran is present in an amount of 0.122 to 0.177 milligram per square centimeter ($mg/cm^2$).

10. The transfer printing substrate of claim 3, wherein an interval between adjacent pillar structures of the plurality of pillar structures ranges from 20 $\mu$m to 90 $\mu$m.

11. The transfer printing substrate of claim 3, further comprising a bond reinforce layer between the handling substrate and the plurality of pillar structures.

12. The transfer printing substrate of claim 3, wherein a shape of each pillar structure of the plurality of pillar structures is configured to increase a contacting area between the plurality of pillar structures and the transfer layer.

13. The transfer printing substrate of claim 3, wherein a cross-section of each pillar structure of the plurality of pillar structures is a cross shape.

* * * * *